United States Patent [19]

Saigoh

[11] Patent Number: 4,817,024
[45] Date of Patent: Mar. 28, 1989

[54] SPECTACLE-FRAME SHAPE DATA PRODUCING METHOD

[75] Inventor: Tsuyoshi Saigoh, Tokyo, Japan

[73] Assignee: Hoya Corporation, Tokyo, Japan

[21] Appl. No.: 800,119

[22] PCT Filed: Feb. 28, 1985

[86] PCT No.: PCT/JP85/00098
§ 371 Date: Oct. 25, 1985
§ 102(e) Date: Oct. 25, 1985

[87] PCT Pub. No.: WO85/04033
PCT Pub. Date: Sep. 12, 1985

[30] Foreign Application Priority Data
Mar. 2, 1984 [JP] Japan .................................. 59-40227
Apr. 6, 1984 [JP] Japan .................................. 59-68869

[51] Int. Cl.⁴ ........................ G02C 7/02; G06F 15/46
[52] U.S. Cl. ................................... 364/577; 364/525;
364/413.01; 382/25; 33/200; 33/507
[58] Field of Search ............... 364/169, 577, 723, 525,
364/413; 33/200, 507; 382/25; 178/18

[56] References Cited

U.S. PATENT DOCUMENTS

| | | |
|---|---|---|
| 3,534,396 | 10/1970 | Hart . |
| 4,361,830 | 11/1982 | Honma et al. .................. 382/25 |
| 4,524,419 | 6/1985 | Headlund et al. .................. 364/525 |
| 4,573,121 | 2/1986 | Saigo et al. .................. 364/413 |
| 4,578,768 | 3/1986 | Racine .................. 178/18 |
| 4,616,107 | 10/1976 | Abb et al. .................. 178/18 |
| 4,713,496 | 12/1987 | Kimura et al. .................. 178/18 |

FOREIGN PATENT DOCUMENTS

| | | |
|---|---|---|
| 21998 | 1/1981 | European Pat. Off. . |
| 61918 | 10/1982 | European Pat. Off. . |
| 92364 | 10/1983 | European Pat. Off. . |

OTHER PUBLICATIONS

JP Abstract 57-158829, vol. 6, No. 265, p. 165, Appln. 56-44778, 9/82.
JP Abstract 58-38919, vol. 7, No. 121, p. 199, Appln. 56-137340, 3/83.
JP Abstract 59-13218, vol. 8, No. 101, p. 273, Appln. 57-122179, 1/84.

Primary Examiner—Parshotam S. Lall
Assistant Examiner—Ellis B. Ramirez
Attorney, Agent, or Firm—Henry Sternberg; Bert J. Lewen

[57] ABSTRACT

A spectacle-frame shape data producing method in which a spline interpolation function is used to digitize the shape M of a spectacle frame to provide spectacle-frame shape data, and the shape M of the spectacle frame is obtained by a lens maker's factory to produce spectacle lenses having prescribed values and an optimum thickness conforming to the spectacle frame.

3 Claims, 4 Drawing Sheets

SPECTACLE-FRAME SHAPE DATA PRODUCING METHOD

TECHNICAL FIELD

This invention relates to a spectacle-frame shape data producing method for producing spectacle lenses conforming to the shape of a spectacle frame.

BACKGROUND ART

Presently, the mode of supplying spectacle lenses in various countries of the world is broadly classified into two modes.

According to one of the modes, a spectacle shop transmits prescribed values and the kind of lenses to a lens maker's factory or a lens wholesale store to acquire raw lenses not subjected to edging, and the lenses are framed in a selected spectacle frame in the spectacle shop to complete the spectacles. This mode is principally employed in Japan, Southeast Asia, Europe, etc. and is called an uncut mode.

According to the other, an optometrist transmits prescribed values and the kind of lenses and position information of the prescribed values of the lenses in a selected spectacle frame, together with the specific spectacle frame, to a lens maker's factory, and, after production and framing of the lenses in the lens maker's factory, the glazed spectacles are sent back to the optometrist. This mode is principally employed in North America and is called a laboratory mode.

These two modes are frequently employed in parallel. Further, there is a type of spectacle shop which carries specific kinds of lenses although the mode is the uncut mode, and, also, there is a lens factory which carries specific kinds of frames although the mode is the laboratory mode. Thus, there is a case where the aforementioned classification is not necessarily applicable. At least, the laboratory mode differs definitely from the uncut mode in that a lens maker's factory obtains the kind and shape of a selected spectacle frame and can prepare spectacle lenses having a thickness most suitable to that spectacle frame.

This capability of proposing spectacle lenses having a thickness most suitable to a selected spectacle frame is significant chiefly in the case of (+) lenses. As is well knnown, a (+) lens has generally such a shape that it is thickest at the center and becomes progressively thinner toward the periphery thereof. Therefore, when the same peripheral thickness is set for lenses having the same degree, a lens having a larger outer diameter has a larger central thickness. The same applies to spectacle frames, and, generally, a larger spectacle frame requires a thicker lens.

However, in the uncut mode, only a few kinds or, at most, two or three kinds of outer diameters are commonly prepared for lenses of the same diameter and are not enough to closely deal with a variety of kinds of spectacle frames. Therefore, lenses having an outer diameter larger than that required must be used. When, for example, lenses having an original diameter of 60 to 70 mm is subjected to edging until they suit the dimensions and shape of a spectacle frame having an outer shape smaller than the lens diameter, the peripheral thickness (referred to hereinafter as an edge thickness) and the central thickness become larger than the edge thickness of the lenses before being subjected to the edging, in the case of convex lenses. When spectacles are made by such a method, especially, when lenses having a large original outer shape and a spectacle frame having a small size compared with the lenses are used to make spectacles, the glazed spectacles are provided with lenses having a vey large edge thickness and a very large central thickness. Thus, this results in the problem that the glazed spectacles are unnecessarily thick and heavy and also awkward.

As an attempt to correct the above problem as much as possible, there has been proposed a so-called outer-diameter specifying method according to which a spectacle shop measures a required minimum outer diameter of lenses to be mounted in a spectacle frame and specifies that diameter to a lens factory. However, this method is insufficient for application to lenses such as lenses for astigmia, prescribed prism lenses and progressive power ophthalmic lenses having different peripheral thicknesses depending on the direction, although they are circular lenses.

In this respect, according to the laboratory mode as described above, a lens factory obtains the kind and shape of spectacle frames to be used and can produce spectacle lenses having a thickness most suitable for each of the individual spectacle frames. However due to the necessity of the step of transportation of an expensive frame, the laboratory mode involves the additional problem that a great risk such as damage to or loss or mislaying of the frame may be encountered.

Thus, when the shape of a spectacle frame can be measured by a simple and convenient method, and the information thereof can be sent to a lens maker's factory, spectacle lenses conforming to the spectacle frame can be produced.

Methods of measuring the shape of a spectacle frame and applying the measured shape of the spectacle frame as an input includes: (a) a method of measuring the shape of the spectacle frame by a measuring instrument such as a scale and applying the measured numerical valves an an input to a computer; (b) a method of converting the shape of eyepieces by mechanical means or electrical means and applying the converted values as an input to a computer; and (c) a method of using an image scanner of an image pick-up tube.

However, the methods described above have been disadvantageous in that none of them is a method according to which an ordering side (a spectacle shop or the like) obtains conveniently and accurately the shape of a spectacle frame as numerical values approximating the actual shape of the spectacle frame, and permits such numerical values to be applied an an input to a computer and easily read out when so required.

DISCLOSURE OF THE INVENTION

It is an object of the present invention to provide a spectacle-frame shape data producing method in which the shape of a spectacle frame is stored as numerical values so that a shape approximate to the actual shape of the spectacle from can be reproduced and to provide a spectacle lens having a thickness most suitable for the shape of the spectacle frame as a result of reproduction of the stored shape of the spectacle frame when so required.

That is, an accurate obtaining of the shape of a spectacle frame is important for the design of good spectacle lenses and is also an essential matter for the determination of the required diameter of spectacle lenses and also for the determination of the central thickness of spectacle lenses. For this purpose, prescribed values of the spectacle lenses are required, and, at the same time, information of the shape of the spectacle frame used by a spectacle wearer is also required. Therefore, the present invention provides a obstacle-frame shape data producing method in which the shape of a spectacle frame can be read out when so required.

BEST MODE FOR CARRYING OUT THE INVENTION

Figure 1:
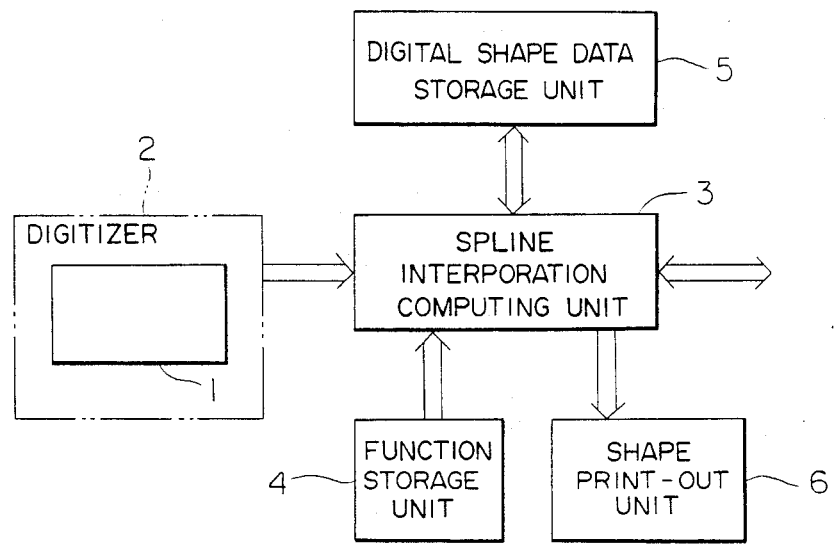
FIG. 1 is a block diagram showing a spectacle-frame shape data apparatus used in a first embodiment of the present invention.

FIG. 1 is a block diagram showing a spectacle-frame shape data apparatus used in a first embodiment of the present invention. 1 designates a sheet having a diagram formed by a horizontal line and a perpendicular line intersecting at right angles, and 2 designates a digitizer. 3 designates a spline interpolation computing unit constituting a CPU of a computer, 4 designates a storage unit storing functions including a spline interpolation formula used for the spline interpolation computation, 5 designates a storage unit storing numerical values of spectacle-frame shape data, units 4 and 5 constituting correspondingly a memory device of a computer such as a main storage, a magnetic disc, a magnetic tape, etc., and 6 designates a spectacle-frame shape print-out unit constituting a line printer of a computer.

Figure 2:
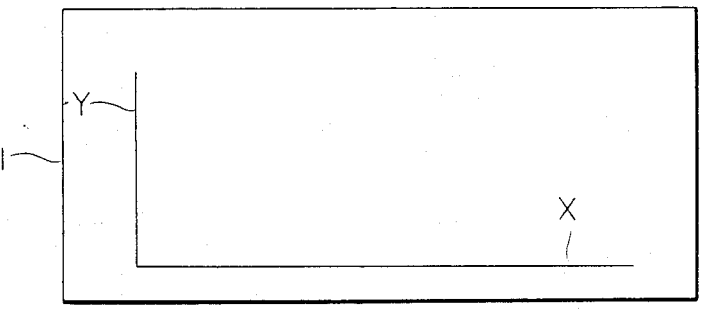
FIG. 2 shows a sheet used in the embodiment for determining the position of a spectacle frame.
Figure 3:
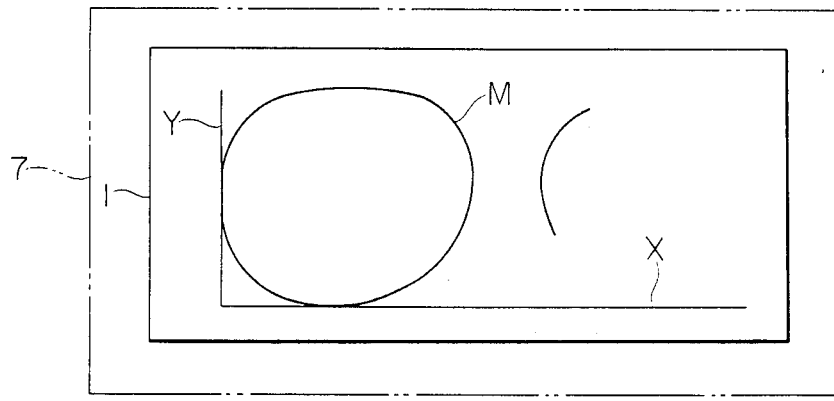
FIG. 3 shows the shape of a spectacle frame used in the embodiment.
Figure 4:
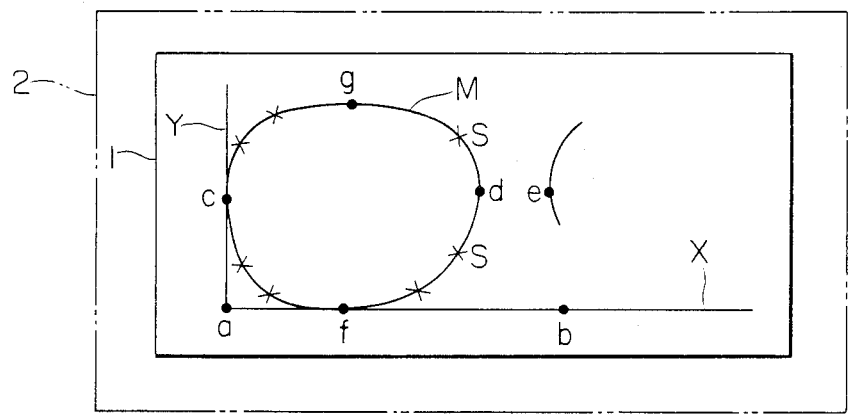
FIG. 4 is shows a digitized input representing the shape of the spectacle frame used in the emobodment.

The function of the spectacle-frame shape data apparatus regarding this first embodiment will be now be described. A spectacle frame whose shape data are to be stored is placed on a sheet 1 on which a diagram is drawn by a horizontal line X and a perpendicular line Y intersecting at right angles as shown in FIG. 2. After positioning the spectacle frame in the horizontal and perpendicular directions, the shape M of the spectacle frame is drawn along the spectacle frame as shown in FIG. 3. Confirmation is then made to assure that the shape of the spectacle frame is accurately drawn along the horizontal line and perpendicular line. Then, the sheet having the shape of the spectacle frame drawn thereon is placed on the digitizer (a numerical processor) 2, and principal points a to g which provide the basis of the shape of the spectacle frame are plotted in the order from the point a to the point g to be numerically processed, as shown in FIG. 4, digitizer 2 thus constituting an input device which reads the X and Y coordinates, e.g. by plotting points on the digitizer with a graphic pen or a cursor in the usual way, and then outputs this information to a computer which thereby automatically converts analog data to digital data. The horizontality is grasped from the two points a and b. The four principal points c, d, f and g indicate the individual extremest sides according to a boxing system representation. Further, the principal point e is the extremest point on the nodal side of the opposite box of the spectacle frame, and the distance between the principal points d and e indicates the DBL (the nodal width) of the spectacle frame.

Then, arbitrarily selected complementary points are plotted between the principal points c, d, f and g to be digitized as shown in FIG. 4. Then, spline interpolation computation is carried out in the spline interpolation computing unit 3, and the resultant shape of the spectacle frame is printed out by the shape print-out unit 6 to confirm that the printed-out shape approximates to the actual shape of the spectacle frame.

When the actual shape of the spectacle frame and the shape of the spectacle frame printed out from the shape print-out unit 6 after computation in the spline interpolation computing unit 3 are not approximate to each other, the shape is approximated by further addition of complementary points S.

When the shape M of the spectacle frame determined according to the spline interpolation computation by the spline interpolation computing unit 3 is necessarily and sufficiently approximated as compared to the actual shape of the spectacle frame, an identification is put on the spectacle, and digital information of the principal points (a to g) and complementary points S and identification information of the spectacle frame are stored in the digital spectacle-frame shape data storage unit 5 as the shape data of the spectacle frame.

This information may be sent to a spectacle maker's factory when so required.

Figure 5:
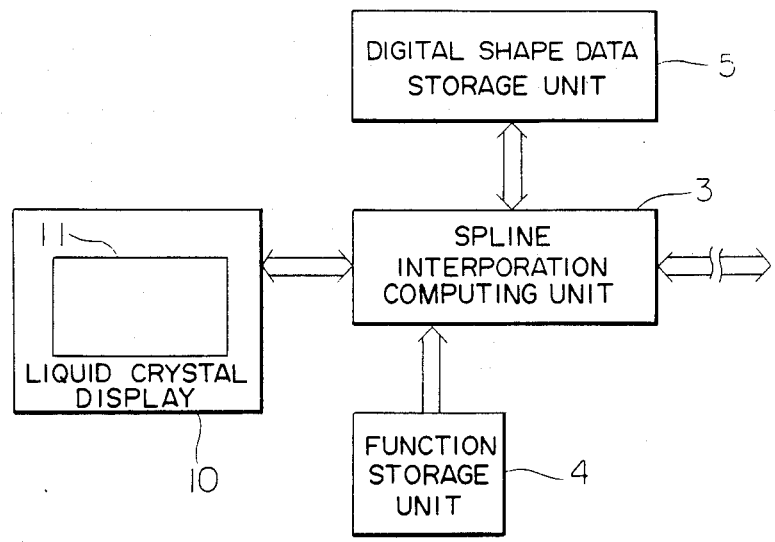
FIG. 5 is a block diagram showing a second spectacle-frame shape data apparatus used in a second embodiment of the present invention.

A second embodiment of the spectacle-frame shape data producing method will next be described. FIG. 5 is a block diagram of the second embodiment. This second embodiment differs from the first embodiment in that a liquid crystal display 10 is used as means for receiving the shape of a spectacle frame as an input and is used also as means for generating the shape of the spectacle frame as its output. That is, although the digitizer and the shape print-out unit receive and generate the shape of a spectacle frame as an input and an output in the first embodiment, the liquid crystal display receives and generates the shape of a spectacle frame as an input and an output in the second embodiment. Thus, the second embodiment is advantageous in that the shape of the spectacle frame can be easily compared.

Figure 6:
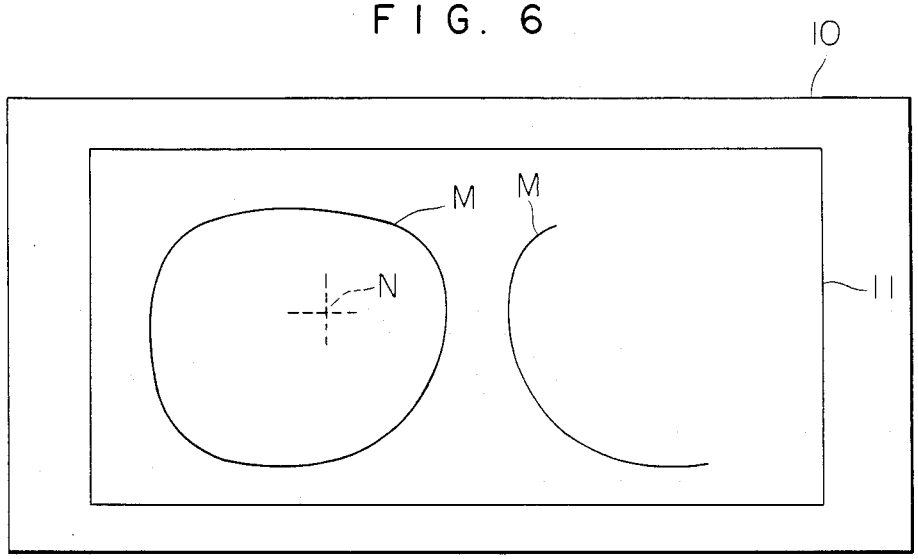
FIG. 6 shows the screen of a liquid crystal display in the second embodiment.
Figure 7:
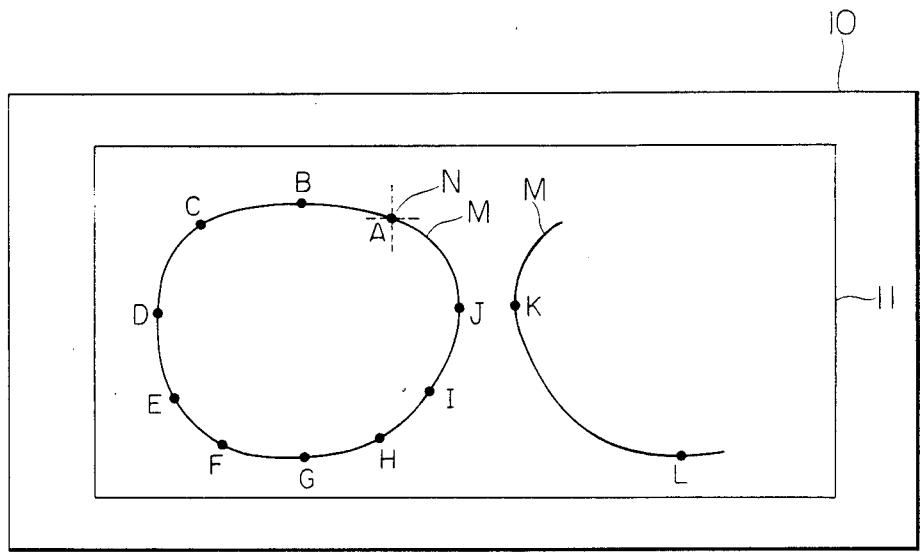
FIG. 7 shows plotting of the shape of a spectacle frame in the second embodiment.

Describing in detail with reference to FIG. 5, 10 designates a liquid crystal display having a flat screen, 3 designates a spline interpolation computing unit, 4 designates a function storage unit, and 5 designates a shape data storage unit. First, the liquid crystal display will be described with reference to FIG. 6. In FIG. 6, a transparent sheet 11 having the shape of a spectacle frame drawn thereon is disposed on the liquid crystal display 10. M designates the drawn shape of the spectacle frame, and N designates a cross-hair cursor. This cross-hair cursor N is movable to any desired position of the X coordinate and Y coordinate. As shown in FIG. 7, the cross-hair cursor N is moved onto principal points (A, B, . . . , K, L) of the shape of the spectacle frame to plot the coordinate positions of the individual points. The plotted principal points are digitized, and the position information of the digitized principal points (A to L) are generated as digital information of the X-Y coordinates. As in the case of the first embodiment, the spline interpolation computing unit 3 carries out the spline interpolation computing operation on the basis of the digital information of the principal points thereby selecting a spline formula connecting smoothly the principal points.

However, when it is difficult, with the principal points only, to provide a smoothly connected shape of the spectacle frame, a plurality of complementary points S are provided as in the case of the first embodiment, and the spline interpolation computing operation is carried out so as to provide a smoothly connected shape of the spectacle frame.

The second embodiment is advantageous in that, in the case of the provision of the complementary points S, these complementary points can be set while comparing the shape of the spectacle frame M applied as an input to the liquid crystal display and the shape of the spectacle frame generated as an output from the liquid crystal display.

Now, the manner of producing spectacle lenses conforming to a spectacle frame on the basis of the aforementioned spectacle-frame shape storage unit will be described. The spectacle-frame shape data apparatus 20 illustrated as the first embodiment and second embodiment is disposed in a spectacle shop. When a spectacle frame desired by a wearer is chosen in the spectacle shop, the prescribed values of the spectacle frame desired by the wearer and the information of the spectacle frame desired by the wearer and obtained by the apparatus are transmitted to a factory of a spectacle lens maker.

Among these information item, the information pertaining to the external appearance of the shape of the spectacle frame is most difficult to obtain. However, the shape of the spectacle frame can be easily obtain by the spectacle-frame shape storage and reproduction unit described in the first embodiment and second embodiment. Therefore, the spectacle lens factory can easily obtain the prescribed values and the shape of the spectacle frame which are required for making the spectacle lenses.

In the manner described above, the lens maker's factory can acquire the information transmitted thereto and conforming to the desire of the spectacle wearer. Therefore, by computing the position where the lens thickness is smallest while conforming to the required prescribed values of the lenses in the spectacle frame and, then, for example, by employing a technique described in U.S. Pat. No. 4,573,121 which has been granted to applicant and another, computing the central thickness of the lenses providing the required thickness at that position, the lenses can be processed to have that surface shape meeting the required prescribed values of the lenses, so that the spectacle lenses conforming to the shape of the spectacle frame can be produced.

INDUSTRIAL APPLICABILITY

According to the present invention as described above, the shapes of spectacle frames having various shapes are digitized to be stored as spectacle-frame shape data, and, when reproduction of the shape of a spectacle frame is desired, the spectacle-frame shape data are read out so that the spectacle frame can be easily reproduced. Moreover, by thus obtaining the shape of the spectacle frame, spectacle lenses conforming to the spectacle frame can also be easily processed on the basis of the required prescribed values. Thus, the present invention obviates the disadvantages of lens processing attributable to the remoteness between a spectacle shop and a spectacle lens processing factory, and in turn possesses sufficient industrial applicability.

I claim:

1. A method of producing spectacle-frame shape data, comprising the steps of:
   (a) drawing a shape of a spectacle-frame to be processed,
   (b) plotting drawn positions of said spectacle-frame shape by position processing means for providing information on such positions, and inputting a predetermined number of extremest side-point positions of the spectacle-frame shape to a computer, and
   (c) producing data between said extremest side-point positions by using a spline interpolation function which is stored in said computer beforehand, and thereafter drawing and reproducing said shape of the spectacle-frame on a display screen thereby to input the spectacle-frame shape data to the computer.

2. Method of claim 1 wherein a digitizer is used in said position processing means.

3. Method of claim 1 wherein a liquid crystal display unit is used in said position processing means for receiving the shape as input information and for generating such shape as corresponding output.

* * * * *